United States Patent

Uchida et al.

[11] Patent Number: 5,468,305
[45] Date of Patent: Nov. 21, 1995

[54] METHOD OF LOWERING PERMEABILITY OF DIFFICULT-TO-WORK CO ALLOY

[75] Inventors: Hiroyuki Uchida; Kazuo Yoshikawa; Seiji Nishi, all of Kobe, Japan

[73] Assignee: Kabushiki Kaisha Kobe Seiko Sho, Kobe, Japan

[21] Appl. No.: 328,524

[22] Filed: Oct. 25, 1994

[30] Foreign Application Priority Data

Oct. 25, 1993 [JP] Japan .................................. 5-266605

[51] Int. Cl.$^6$ .................................................. H01F 1/00
[52] U.S. Cl. ............................................ 148/120; 148/674
[58] Field of Search ................................. 148/674, 120, 148/121

[56] References Cited

U.S. PATENT DOCUMENTS 5,282,946  2/1994  Kinoshita et al. ................. 204/298.13
5,334,267  8/1994  Taniguchi et al. ...................... 148/425

Primary Examiner—John Sheehan
Attorney, Agent, or Firm—Oblon, Spivak, McClelland, Maier & Neustadt

[57] ABSTRACT

Disclosed is a method of lowering the permeability of a difficult-to-work Co alloy by introducing high working strain. It includes the steps of: making a Co alloy by melting, the Co alloy containing 0.1 to 40 atomic % of Ni and/or 0.1 to 40 atomic % of Pt, and 0.5 to 10 atomic % of one or more kinds of elements selected from a group consisting of Ta, Mo, W, V, Nb, Hf, Zr, Ti and B (the upper limit of B: 5 atomic %), the balance being 50 atomic % or more of Co and inevitable impurities; preparing a sheet like ingot having a thickness of 30 mm or less using the Co alloy; and covering the surface of the ingot with a metal capsule or coating it with a glass lubricant, and hot-rolling the treated ingot in such a manner that the reduction is performed in two stages accompanied by re-heating and the whole reduction is 30% or more.

13 Claims, 3 Drawing Sheets

A = 60mm
B = 45mm
C = 30mm
D = 15mm

METHOD OF LOWERING PERMEABILITY OF DIFFICULT-TO-WORK CO ALLOY

BACKGROUND OF THE INVENTION

1. Field of the Invention

The present invention relates to a method of lowering the permeability of a Co alloy sputtering target which is used in the formation of a Co alloy film as a recording material in the electric field, and particularly to a method of lowering the permeability of a difficult-to-work Co alloy by introducing working strain.

2. Description of the Related Art

As recording materials used in the electric field, there have been generally used films of Co alloys such as Co-Ni-Pt, Co-Cr-Ni, and Co-Cr-Ta alloys. Recently, these recording materials have been required to be further increased in recording density, and Co alloys capable of satisfying the requirement have been developed mainly by increasing the kinds and amounts of alloy components.

Co alloy targets used in the formation of films require various characteristics, and particularly, they strongly require the lowering in permeability. The lowering in permeability is most effective to enhance the sputtering efficiency of Co alloy targets and it also greatly contributes to the reduction in cost from the viewpoint of users.

In general, to lower the permeability of Co alloy targets, strain is introduced to a Co alloy by cold-working or hot-working, exemplified in Examined Japanese Patent Publication No. HEI 2-49384 and Unexamined Japanese Patent Publication No. SHO 61-257473. This method involves a melting-casting-rolling process, and which is relatively simply applicable for conventional Co alloys excellent in workability without an increase in cost. This method, however, has a difficulty in working Co alloys recently developed or being in the course of development, because these alloys are added with Boron (B) forming a low melting point compound or added with a large amount of a high melting point metal for strengthening the base phase.

From this reason, Co alloy targets have come to be mainly manufactured by a precision casting process or a powder metallurgy process.

The precision casting process has a merit in manufacturing Co alloy targets at a low cost; however, films formed of the Co alloy targets manufactured by this process frequently cause a trouble by arcings during the sputtering due to casting defects. To avoid such inconvenience, the cooling rate during casting must be lowered. However, the lowered cooling rate causes the coarsening of crystal grains, and aggregation and coarsening of precipitations, which makes it difficult to work the Co alloy ingot obtained by this casting, thereby failing to achieve the lowering in permeability.

On the other hand, the powder metallurgy process is effective to form a difficult-to-work material; however, it has a disadvantage in the terms of the increased cost, and therefore, it has been little put in practical use as a method of manufacturing Co alloy targets.

SUMMARY OF THE INVENTION

An object of the present invention is to provide a method of lowering the permeability of a difficult-to-work Co alloy by introducing high working strain without any of the above-described problems of the prior art methods.

To achieve the above object, according to the present invention, there is provided a method of lowering the permeability of a difficult-to-work Co alloy by introducing high working strain. The method includes the steps of: making a Co alloy by melting, the Co alloy containing 0.1 to 40 atomic % of Ni and/or 0.1 to 40 atomic % of Pt, and 0.5 to 10 atomic % of one or more kinds of elements selected from a group consisting of Ta, Mo, W, V, Nb, Hf, Zr, Ti and B (the upper limit of B: 5 atomic %), the balance being 50 atomic % or more of Co and inevitable impurities; preparing a sheet like ingot having a thickness of 30 mm or less using the Co alloy; and covering the surface of the ingot with a metal capsule or coating it with a glass lubricant, and hot-rolling the treated ingot in such a manner that the reduction is performed in two stages accompanied by reheating and the whole reduction is 30% or more.

The above-described Co alloy may contain 4 to 25 atomic % of Cr together with or in place of the elements of Ni and Pt.

DETAILED DESCRIPTION OF THE PREFERRED EMBODIMENTS

Figure 1:
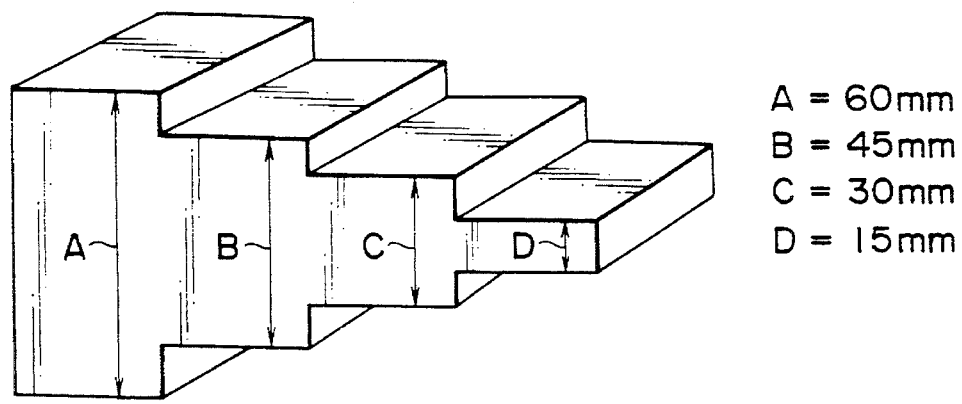
FIG. 1 is an illustrative view of a casting shape in examples of the present invention.

The present inventors have first examined the cause of the deterioration of the workability of Co alloy as described above. As a result, it was revealed that intermetallic compounds are precipitated during the solidification of Co alloy, and during working, cracks are first generated at the portions where the intermetallic compounds are precipitated and are then propagated to be continuous to each other, resulting in breakage. In an as-cast material, since intermetallic compounds are precipitated at portions between dendrite arms to the finally solidified portions, the precipitations tend to be continuous to each other, thereby accelerating the generation of cracks, resulting in the poor workability.

To improve the workability of Co alloy, there may be considered methods of refining crystal grains, refining precipitations, and suppressing the generation amount of precipitations. As for the methods of refining crystal grains and of refining precipitations (particularly, suppression in continuous dispersion of precipitations), the powder metallurgy process seems to be most advantageous. However, as a result of the examination by the present inventors, it was revealed that the good dispersion of precipitations shortens the distance between particles, which increases a high temperature strength and rather lowers a high temperature ductility, thereby deteriorating the workability. Next, as for the method of suppressing the generation amount of precipitations, which is considered to be most effective for the improvement in the workability, the powder metallurgy process seems to be not necessarily advantageous. The reason for this is that the powder metallurgy process requires a long term heating at a high temperature, and thereby the generation amount of precipitations are often increased by this heating compared with the casting process.

On the basis of these knowledges, as a method of suppressing the dispersion of precipitations to a degree that is not comparable with the dispersion state obtained by the powder metallurgy process but at least cut the continuity of precipitations, and also suppressing the amount of precipitations, the present inventors have adopted a melting-casting process, and particularly, examined the cooling rate during casting. As a result, it was found that the microstructure of an ingot can be controlled into an intermediate structure between those obtained by the powder metallurgy process and the conventional melting process by specifying the thickness of an ingot at a specified value or less and increasing the cooling rate during casting. The workability of the ingot having the above intermediate structure was evaluated, as a result of which it was improved by about twice or more. Such an ingot could be subjected to cold-rolling as it was, and therefore, it was expected to be reduced in the permeability.

However, when the thickness of an ingot is thinned, the material often generates planar defects by shrinkage cavities at the finally solidified portions of the central area of the ingot. The present inventors have solved this inconvenience. Namely, it becomes possible to eliminate casting defects and simultaneously reduce the permeability by introducing the controlled rolling under a suitable condition. Specifically, the hot rolling step is performed into two stages for eliminating the casting defects and reducing the permeability, wherein the high reduction is performed at a high temperature and the low reduction is performed at a low temperature, and further the workability (total reduction) is set to be 30% or more. Namely, the elimination of casting defects requires the total reduction of 30% or more, preferably, about 35%, and thereby the desired effect cannot be obtained without re-heating, and accordingly, the above rolling condition is determined so that the increase in the permeability is suppressed even when the re-heating is performed. In the present invention, the two-stage reduction capable of achieving the function described above is performed. Multi-stage (three or more) reduction causes the lowering of the permeability during the re-heating. Moreover, since a difficult-to-work Co alloy of the present invention is sensitive to cracking due to the lowering of the temperature during working (having a large temperature dependency of ductility), the controlled rolling easily causes cracks. To suppress such cracks, in the present invention, an ingot is covered with a metal capsule or coated with glass lubricant for enhancing the heat-insulation between rolls and the ingot, thus enabling the controlled rolling.

The requirements specified in this invention will be described in detail below. First, the reason why the components of the Co alloy of the present invention are limited is as follows:

Ni: 0.1 to 40 Atomic % and/or Pt: 0.1 to 40 Atomic %

Ni and Pt are effective to enhance the coercive force of a Co alloy made magnetic recording film, and each of which is required to be added in an amount of 0.1 atomic % or more. However, when the content of each element is in the range of more than 40 atomic %, the structure of the Co alloy is converted from Co to Co, resulting in the reduced magnetic characteristics.

Cr: 4 to 25 Atomic %

Cr is effective to enhance the coercive force of a Co alloy made magnetic recording film. To obtain this effect, the Cr content must be in the range of 4 atomic or more. However, over 25 atomic %, the saturated magnetization becomes zero, and the Co alloy becomes non-magnetic.

One Kind or More of Elements Selected From A Group Consisting of Ta Mo W V, Nb Hf, Zr Ti and B: 0.5 To 10 Atomic %

The addition of these elements is effective to enhance the coercive force of a Co alloy magnetic recording film and to reduce noise. To obtain these effects, each or the total amount of these elements must be added in an amount of 0.5 atomic % or more. When these elements are excessively added, the magnetic characteristics and the workability are rather significantly reduced. The upper limit of the content is thus specified at 10 atomic %. In particular, the excessive addition of B forms a low melting point compound, and deteriorates the workability, so that the upper limit of the B content is specified at 5 atomic %.

In the present invention, the Co alloy basically contains the above elements, the balance being Co and inevitable impurities, wherein the Co content is required to be in the range of 50 atomic % or more.

On the other hand, the reason why the thickness of an ingot is specified to be 30 mm or less is to rapidly increase the cooling rate, which achieves the discontinuity of an eutectic compound, thus improving the workability.

The present inventors have examined the effect of the thickness of an ingot as follows.

A Co-7Cr-25Ni-4Ta-3B alloy was prepared by vacuum melting, and was cast in the shape shown in FIG. 1. A test piece was sampled from the ingot in the longitudinal direction (rolling direction), and was subjected to tensile test for examining the relationship between the thickness of the ingot and the hot workability. The test piece was heated at 1100° C. (simulating the actual rolling condition) and cooled at each testing temperature, and was subjected to tensile test at a strain rate of 2/s. The workability was evaluated in terms of the reduction value obtained by the above tensile test.

Figure 2:
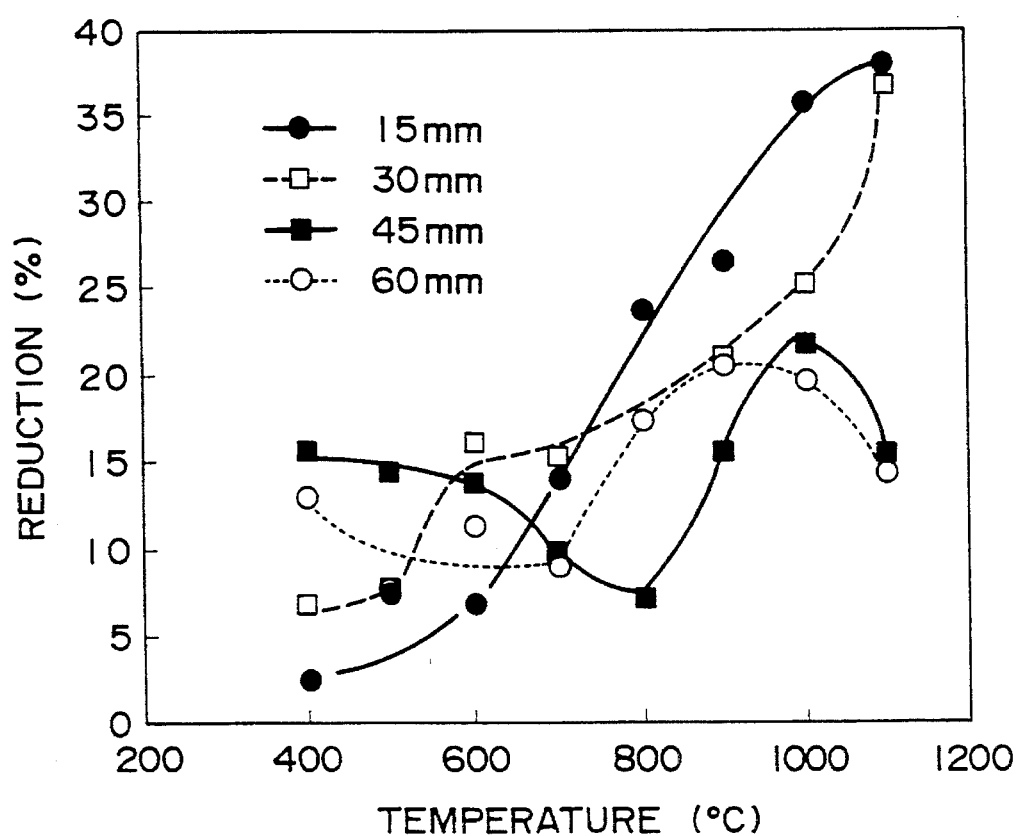
FIG. 2 is a graph showing the relationship between the thickness of an ingot and the hot-workability (reduction value)

The results are shown in FIG. 2. From this figure, it is revealed that when the thickness of an ingot is more than 30 mm, the reduction value is not significantly changed; while when it is 30 mm or less, the reduction value is significantly increased, that is, there appears the significant effect of improving the workability. However, on the low temperature side, the effect is abruptly reduced, and rather the workability is deteriorated, thus increasing the sensitivity against crack.

Figure 3:
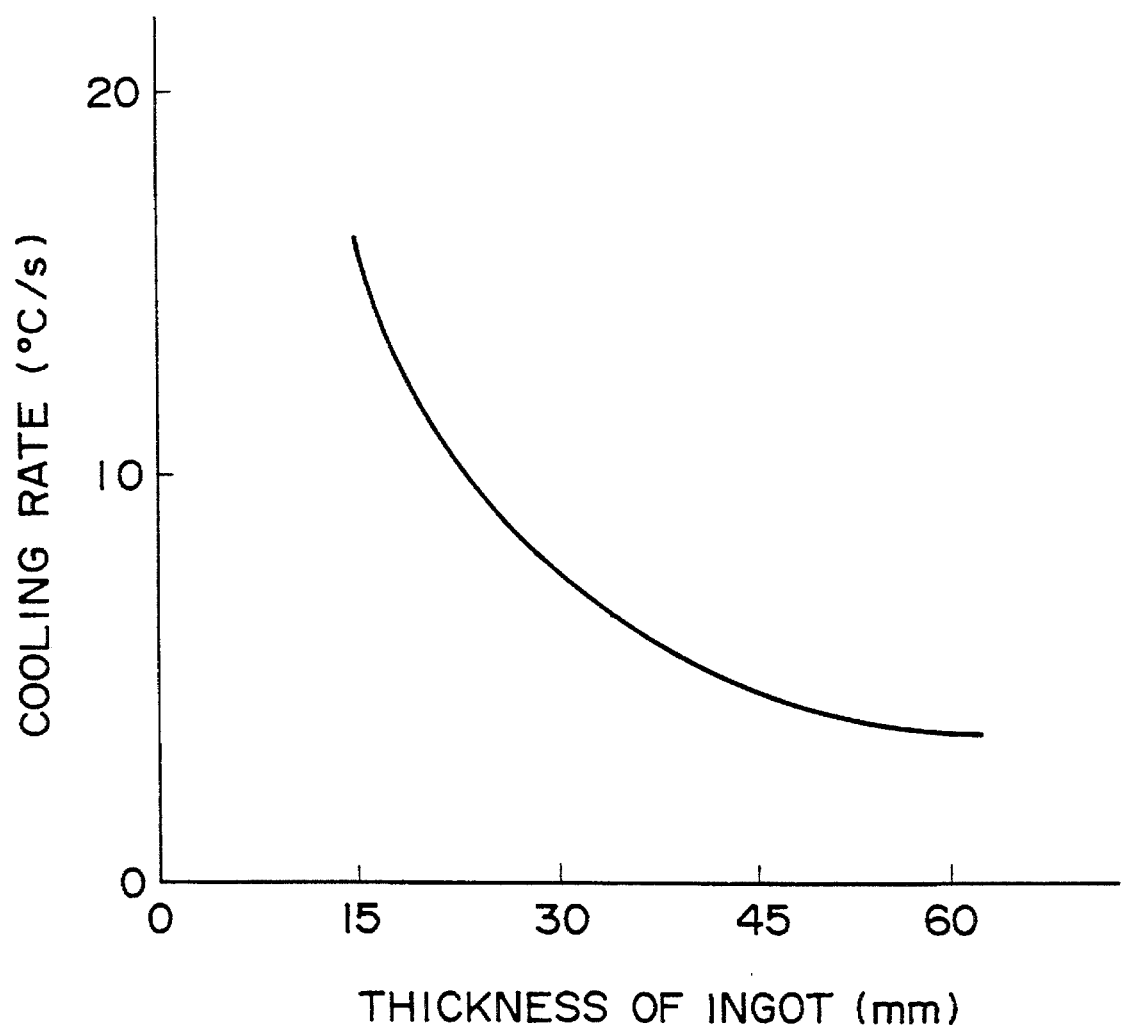
FIG. 3 is a graph showing the relationship between the thickness of an ingot and the cooling rate.

FIG. 3 shows the relationship between the thickness of an ingot and the cooling rate. From this figure, it is revealed that when the thickness of an ingot is set to be 30 mm or less, the cooling rate can be rapidly increased.

A Co-14Cr-4Ta-3B alloy was prepared by vacuum melting, and was cast in ingots having the thicknesses 12 mm and 45 mm Each ingot was hot-rolled at 1100° C. and was examined for cracking. As a result, for the ingot having the thickness of 45 mm, cracks were generated by hot-rolling at a low reduction. On the contrary, for the ingot having the thickness of 12 mm, there was not recognized any crack. The desired sheet was thus manufactured using the ingot having the thickness of 12 mm.

As described above, it is very important to specify the thickness of an ingot to be 30 mm or less for improving the workability. To obtain an ingot having a thickness of 30 mm or less, the ingot must be manufactured by a casting process. The casting process is not particularly limited, and may include the method disclosed in Japanese Patent Application No. HEI 4-315144 which is previously proposed by the present applicant. Moreover, prior to manufacture of an ingot, Co alloy must be prepared by melting. This melting process for Co alloy may include inert gas sealing atmospheric melting, other than the above-described vacuum melting.

In the present invention, upon hot-rolling, an ingot is required to be covered with a metal capsule and coated with glass lubricant for suppressing the reduction in temperature, because the alloy is large in the temperature dependency of ductility and the ductility is abruptly decreased when the temperature is lowered. At this time, the total reduction is specified to be 30% or more for eliminating the planar defects due to shrinkage cavity generated at the central portion of an ingot by a sheet casting process as described above.

The reason why the reduction is performed in two stages upon hot-rolling is to separate the step of eliminating casting defects from the step of lowering the permeability. In the step of eliminating casting defects, a large reduction is performed at a high temperature. On the other hand, in the step of lowering the permeability (introduction of working strain), a small reduction is performed at a low temperature. This is intended to suppress the recovery during working and re-heating, and re-crystallization. Thus, it becomes possible to obtain a Co alloy having a low permeability in the hot-rolling step. In addition, the heating temperature during hot-rolling is preferably in the range of 900° C. or more.

The cold-rolling at a reduction of 10% or less may be performed after hot-rolling or after hot-rolling and re-heating. This is effective to reduce the permeability of Co alloy. In cold-rolling, the permeability is reduced with an increase in the cold workability. However, when the reduction is 10% or more, the effect is made smaller and cracks are easily generated.

The present invention will be more clearly understood by way of the following examples, but is not limited thereto. Accordingly, various modifications of the examples should be considered to be within the technical scope of the present invention.

EXAMPLE 1

A Co-14Cr-6Pt-4B alloy was prepared by vacuum melting, and was cast into an ingot having a thickness of 19 mm. The ingot was subjected to surface grinding and then heated at 1100° C., after which it was first hot-rolled at a reduction of 10% and subsequently hot-rolled at a reduction of 8%. The ingot was re-heated at the same temperature, and was hot-rolled in the same manner. The hot-rolled sheets being as-cast, before the reheating, and after the final hot-rolling were measured for the permeability, which gave the results shown in Table 1. As is apparent from Table 1, the permeability is decreased in the order of the hot-rolled sheets being as-cast, before the re-heating, and after the final hot-rolling.

TABLE 1

| Manufacturing process | Permeability |
| --- | --- |
| As-cast | 90 |
| As cast-heating at 1100° C. hot rolling (reduction: 10%, 8%) | 62 |
| As cast-heating at 1100° C. hot rolling (reduction: 10%, 8%) heating at 1100° C. hot rolling (reduction: 10%, 7%) | 39 |

EXAMPLE 2

Figure 4:
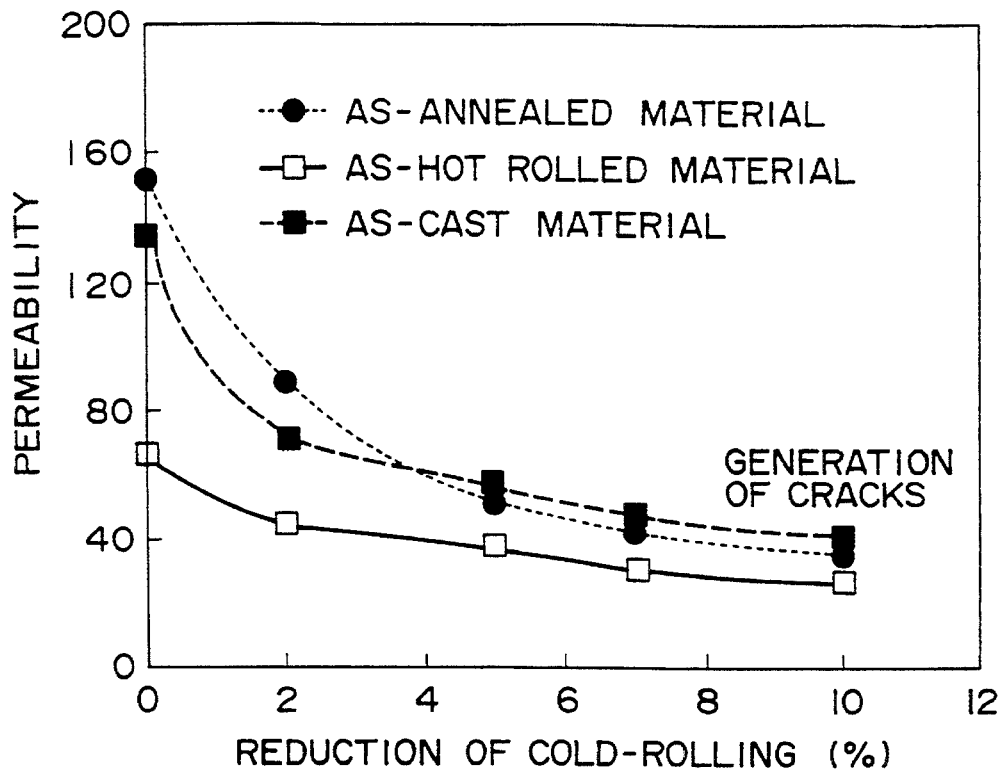
FIG. 4 is a graph showing the relationship between the permeability and the reduction of cold-rolling.

A Co-7Cr-25Ni-4Ta-3B alloy was prepared by melting, and was cast into an ingot having a thickness of 12 mm. The ingot was hot-rolled, and further cold-rolled at a reduction of 0 to 10% after heat-treatment. The sample being as hot-rolled, and the sample subjected to cold-rolling were measured for the permeability. FIG. 4 shows the relationship between the permeability and the cold-workability. As is apparent from this figure, the permeability is lowered with an increase in cold-workability, and the effect becomes smaller with the increase in cold-workability. In this alloy, however, when the cold-workability is 10% or more, cracks were generated.

EXAMPLE 3

Figure 5:
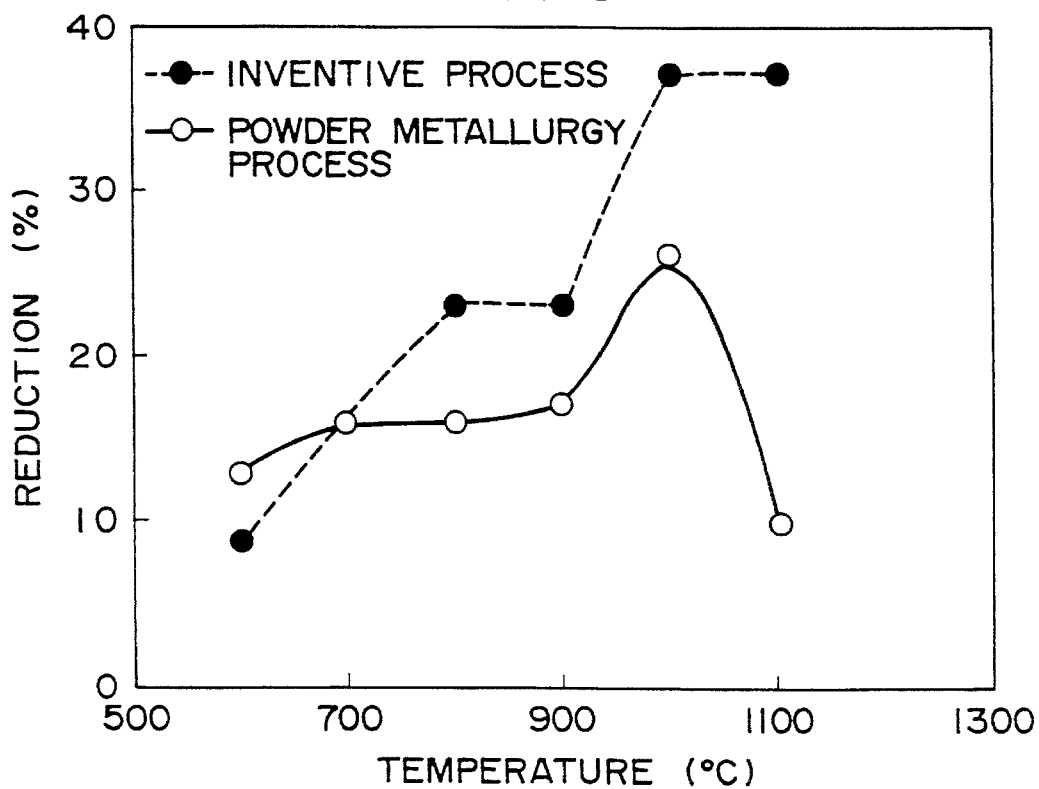
FIG. 5 is a graph showing the relationship between the temperature in hot-rolling and the workability (reduction value).

A Co-7Cr-25Ni-4Ta-3B alloy was prepared by melting, and was cast into an ingot. The ingot was re-melted, and a Co-alloy powder was manufactured by Ar gas atomizing using the re-melted alloy. The powder was put in a mild steel capsule, and was subject to vacuum degassing at 400° C.×2 h and subsequently to HIP treatment at 1100° C.×3 h. The as-cast sample and the powder sample were examined for the workability. The samples were heated and then cooled at each testing temperature, and were subjected to tensile testing at a strain rate 2/s. They were thus evaluated in terms of the reduction value, which gave the results shown in FIG. 5. From this figure, it is revealed that the as-cast sample of the present invention is superior in the workability to the powder sample. As expected from the result of the microscopic observation, in the powder material, precipitations are finely dispersed, so that the high temperature deformability is increased by 30% compared with the material of the present invention, thus reducing the ductility.

What is claimed is:

1. A method of lowering the permeability of a difficult-to-work Co alloy, which comprises:

a) preparing a Co alloy by melting, said Co alloy comprising:

i) 0.1 to 40 atomic % of Ni or 0.1 to 40 atomic % of Pt, or both; and ii) 0.5 to 10 atomic % of one or more elements selected from the group consisting of Ta, Mo, W, V, Nb, Hf, Zr, Ti and B, with the proviso that the upper limit of B is 5 atomic %, the balance being 50 atomic % or more of Co and inevitable impurities;

b) preparing a sheet-shaped ingot having a thickness of 30 mm or less using said Co alloy; and c) covering the surface of said ingot with a metal capsule or coating said ingot with a glass lubricant, and hot-rolling and performing reduction of said ingot at least twice, with re-heating therebetween, whereby an entire reduction of 30% or more is obtained.

2. The method of claim 1, wherein said whole reduction is about 35%.

3. The method of claim 1, wherein said sheet-shaped ingot has a thickness of about 12 mm.

4. The method of claim 1, wherein three or more reductions are effected in step c).

5. The method of claim 1, wherein said sheet-shaped ingot is first hot-rolled at a reduction of 10%, and then subsequently hot-rolled at a reduction of 8%.

6. A method of lowering the permeability of a difficult-to-work Co alloy, which comprises:
 a) preparing a Co alloy by melting, said Co alloy comprising:
  i) 4 to 25 atomic % of Cr; and
  ii) 0.5 to 10 atomic % of one or more elements selected from the group consisting of Ta, Mo, W, V, Nb, Hf, Zr, Ti and B, with the proviso that the upper limit of B is 5 atomic %, the balance being 50 atomic % or more of Co and inevitable impurities;
 b) preparing a sheet-shaped ingot having a thickness of 30 mm or less using said Co alloy; and
 c) covering the surface of said ingot with a metal capsule or coating said ingot with a glass lubricant, and hot-rolling and performing reduction of said ingot at least twice, with re-heating therebetween, whereby an entire reduction of 30% or more is obtained.

7. The method of claim 6, wherein said entire reduction is about 35%.

8. The method of claim 6, wherein said sheet-shaped ingot has a thickness of about 12 mm.

9. The method of claim 6, wherein three or more reduction are effected in step c).

10. A method of lowering the permeability of a difficult-to-work Co alloy, comprising:
 a) 0.1 to 40 atomic % of Ni or 0.1 to 40 atomic % of Pt, or both;
  i) 4 to 25 atomic % of Cr; and
  ii) 0.5 to 10 atomic % of one or more elements selected from the group consisting of Ta, Mo, W, V, Nb, Hf, Zr, Ti and B, with the proviso that the upper limit of B is 5 atomic %, the balance being 50 atomic % or more of Co and inevitable impurities;
 b) preparing a sheet-shaped ingot having a thickness of 30 mm or less using said Co alloy; and
 c) covering the surface of said ingot with a metal capsule or coating said ingot with a glass lubricant, and hot-rolling and performing reduction of said ingot at least twice, with re-heating therebetween, whereby an entire reduction of 30% or more is obtained.

11. The method of claim 10, wherein said entire reduction is about 35%.

12. The method of claim 10, wherein said sheet-shaped ingot has a thickness of about 12 mm.

13. The method of claim 10, wherein three or more reductions are effected in step c).

* * * * *